(12) United States Patent
Park et al.

(10) Patent No.: US 9,711,288 B2
(45) Date of Patent: Jul. 18, 2017

(54) COMPOSITE ELECTRONIC COMPONENT AND BOARD FOR MOUNTING THE SAME

(71) Applicant: SAMSUNG ELECTRO-MECHANICS CO., LTD., Suwon-Si, Gyeonggi-Do (KR)

(72) Inventors: Min Cheol Park, Suwon-Si (KR); Sang Soo Park, Suwon-Si (KR)

(73) Assignee: SAMSUNG ELECTRO-MECHANICS CO., LTD., Suwon-si, Gyeonggi-Do (KR)

( * ) Notice: Subject to any disclaimer, the term of this patent is extended or adjusted under 35 U.S.C. 154(b) by 284 days.

(21) Appl. No.: 14/258,711

(22) Filed: Apr. 22, 2014

(65) Prior Publication Data
US 2015/0116891 A1  Apr. 30, 2015

(30) Foreign Application Priority Data
Oct. 31, 2013  (KR) .................. 10-2013-0130787

(51) Int. Cl.
*H01G 4/40* (2006.01)
*H01F 27/28* (2006.01)
(Continued)

(52) U.S. Cl.
CPC ........... *H01G 4/40* (2013.01); *H01F 27/2804* (2013.01); *H01G 2/06* (2013.01); *H05K 1/181* (2013.01);
(Continued)

(58) Field of Classification Search
USPC ........................................ 361/270
See application file for complete search history.

(56) References Cited

U.S. PATENT DOCUMENTS 6,727,782 B2  4/2004 Sasaki et al.
7,667,299 B2  2/2010 Mori et al.
(Continued)

FOREIGN PATENT DOCUMENTS

CN  1235336 C   1/2006
CN  1783376 A   6/2006
(Continued)

OTHER PUBLICATIONS

Office Action issued Apr. 1, 2017 in corresponding Chinese Patent Application 201410183612.9, with English language translation.

*Primary Examiner* — Zeev V Kitov
(74) *Attorney, Agent, or Firm* — McDermott Will & Emery LLP

(57) ABSTRACT

A composite electronic component may include: a composite body including a combination of a capacitor formed of a ceramic body including a plurality of dielectric layers and first and second internal electrodes disposed to face one another with the dielectric layers interposed therebetween, and an inductor formed of a magnetic body including a coil unit; a first external electrode formed on the first lateral surface of the ceramic body and electrically connected to the first internal electrodes and a second external electrode formed on the second lateral surface of the ceramic body and electrically connected to the second internal electrodes; third and fourth external electrodes formed on first and second end surfaces of the magnetic body and connected to the coil unit, and first and second dummy electrodes formed on first and second end surfaces of the magnetic body.

5 Claims, 13 Drawing Sheets

(51) Int. Cl.
   *H05K 1/18*   (2006.01)
   *H01G 2/06*   (2006.01)
   H05K 1/02     (2006.01)
   H05K 3/34     (2006.01)

(52) U.S. Cl.
   CPC .... *H01F 2027/2809* (2013.01); *H05K 1/0233* (2013.01); *H05K 3/3442* (2013.01); *H05K 2201/1003* (2013.01); *H05K 2201/1006* (2013.01); *H05K 2201/10015* (2013.01); *H05K 2201/10636* (2013.01); *H05K 2201/2045* (2013.01); *Y02P 70/611* (2015.11)

(56) References Cited

U.S. PATENT DOCUMENTS

| | | | |
|---|---|---|---|
| 2003/0030510 A1* | 2/2003 | Sasaki | H03H 7/0115 333/185 |
| 2006/0120018 A1 | 6/2006 | Lee et al. | |
| 2007/0145575 A1* | 6/2007 | Mori | H05K 1/023 257/723 |
| 2011/0309895 A1 | 12/2011 | Ahn et al. | |
| 2013/0250476 A1 | 9/2013 | Chung et al. | |
| 2014/0091874 A1* | 4/2014 | Cook | H03H 7/01 333/12 |

FOREIGN PATENT DOCUMENTS

| | | |
|---|---|---|
| CN | 102291100 A | 12/2011 |
| CN | 103325568 A | 9/2013 |
| JP | 06-325977 A | 11/1994 |
| KR | 2003-0014586 A | 2/2003 |
| KR | 10-2010-0049846 A | 5/2010 |

\* cited by examiner

COMPOSITE ELECTRONIC COMPONENT AND BOARD FOR MOUNTING THE SAME

CROSS-REFERENCE TO RELATED APPLICATION

This application claims the benefit of Korean Patent Application No. 10-2013-0130787 filed on Oct. 31, 2013, with the Korean Intellectual Property Office, the disclosure of which is incorporated herein by reference.

BACKGROUND

The present disclosure relates to a composite electronic component including a plurality of passive elements and a board for mounting the same.

Recently, electronic devices have been miniaturized, while still requiring diversity in the functionality thereof to allow products to be formed to be lighter, thinner, shorter, and smaller while retaining high levels of performance.

In order to meet various service requirements, electronic devices have a power semiconductor-based power management integrated circuit (PMIC) undertaking a function of effectively controlling and managing limited battery charge resources.

However, the provision of various functions in electronic devices leads to an increase in the number of DC/DC convertors provided in a PMIC and the number of passive elements required to be provided in a power input terminal and a power output terminal of a PMIC as well.

In this case, an area for disposing components of electronic devices is inevitably increased, posing an obstacle to the miniaturization of electronic devices.

In addition, wiring patterns of the PMIC and peripheral circuits thereof generate significant amounts of noise.

Meanwhile, a multilayer ceramic capacitor may include a plurality of dielectric layers and internal electrodes, having a structure in which the internal electrodes having different polarities are alternately laminated between the dielectric layers.

The dielectric layers have piezoelectric and electrostrictive properties. Thus, when a Direct Current (DC) or an Alternating Current (AC) voltage is applied to the MLCC, a piezoelectric effect occurs between internal electrodes, generating vibrations.

The generated vibrations may be transmitted to a printed circuit board (PCB) on which the MLCC is mounted, through solders of the MLCC, rendering the entirety of the PCB an acoustically radiating surface to generate vibratory sound as noise.

Vibratory sound may correspond to audio frequencies ranging from 20 Hz to 2000 Hz, making users uncomfortable, and such a vibratory sound, which may cause discomfort to users, is known as acoustic noise.

Research into methods of reducing acoustic noise is required.

SUMMARY

An aspect of the present disclosure may provide a composite electronic component having a reduced component mounting area in a driving power supply system, and a board for mounting the same.

An aspect of the present disclosure may also provide a composite electronic component capable of suppressing the generation of noise in a driving power supply system, and a board for mounting the same.

According to an aspect of the present disclosure, a composite electronic component may include: a composite body including a combination of a capacitor formed of a ceramic body including a plurality of dielectric layers and first and second internal electrodes disposed to face one another with the dielectric layers interposed therebetween, the first internal electrodes respectively having a lead out portion exposed to a first lateral surface and the second internal electrodes respectively having a lead out portion exposed to a second lateral surface, and an inductor formed of a magnetic body including a coil unit; a first external electrode formed on the first lateral surface of the ceramic body and electrically connected to the first internal electrodes and a second external electrode formed on the second lateral surface of the ceramic body and electrically connected to the second internal electrodes; third and fourth external electrodes formed on first and second end surfaces of the magnetic body and connected to the coil unit, and first and second dummy electrodes formed on first and second end surfaces of the magnetic body; wherein the capacitor is disposed on the top of the inductor, and the composite body includes an input terminal formed of the third external electrode, output terminals including a first output terminal formed of the fourth external electrode and a second output terminal formed of the second dummy electrode and the second external electrode, and a ground terminal formed of the first dummy electrode and the first external electrode.

The magnetic body may be configured by laminating a plurality of magnetic layers respectively having a conductive pattern formed thereon, and the conductive patterns may constitute the coil unit.

The inductor may be a thin film type inductor in which the magnetic body includes an insulating layer and a coil formed on at least one surface of the insulating substrate.

The magnetic body may include a core and a winding coil wound around the core.

The inductor may be a power inductor.

The capacitor and the inductor may be connected by a conductive adhesive.

According to another aspect of the present disclosure, a composite electronic component may include: a composite body including a combination of a capacitor formed of a ceramic body including a plurality of dielectric layers and first and second internal electrodes disposed to face one another with the dielectric layers interposed therebetween, the first internal electrodes respectively having a lead out portion exposed to a first lateral surface and the second internal electrodes respectively having a lead out portion exposed to a second lateral surface, and an inductor formed of a magnetic body including a coil unit; a first external electrode formed on the first lateral surface of the ceramic body and electrically connected to the first internal electrodes, a second external electrode formed on the second lateral surface of the ceramic body and electrically connected to the second internal electrodes, and first and second dummy electrodes formed on first and second end surfaces of the ceramic body; and third and fourth external electrodes formed on the first and second end surfaces of the magnetic body and connected to the coil unit, wherein the inductor is disposed on the top of the capacitor, and the composite body may include an input terminal formed of a combination of the first dummy electrode and the third external electrode, output terminals including a first output terminal formed of a combination of the second dummy electrode and the fourth external electrode and a second output terminal formed of the second external electrode, and a ground terminal formed of the first external electrode.

The magnetic body may be configured by laminating a plurality of magnetic layers respectively having a conductive pattern formed thereon, and the conductive patterns may constitute the coil unit.

The inductor may be a thin film type inductor in which the magnetic body includes an insulating layer and a coil formed on at least one surface of the insulating substrate.

The magnetic body may include a core and a winding coil wound around the core.

The inductor may be a power inductor.

The capacitor and the inductor may be connected by a conductive adhesive.

According to another aspect of the present disclosure, a composite electronic component may include: an input terminal receiving converted power from a power management unit; a power smoothing unit including a composite body smoothing power and including a combination of a capacitor formed of a ceramic body including a plurality of dielectric layers and internal electrodes, the internal electrodes being disposed to face one another with the dielectric layers interposed therebetween, and an inductor formed of a magnetic body including a coil unit; an output terminal supplying smoothed power; and a ground terminal for grounding.

The input terminal may be formed on a first end surface of the composite body, the output terminal may include a first output terminal formed on a second end surface of the composite body and a second output terminal formed on a second lateral surface of the composite body and may be connected to the coil unit of the inductor and second internal electrodes of the capacitor, and the ground terminal may be formed on a first lateral surface of the composite body and connected to first internal electrodes of the capacitor.

The internal electrodes may include first internal electrodes respectively having a lead out portion exposed to the first lateral surface of the composite body and second internal electrodes respectively having a lead out portion exposed to the second lateral surface.

The capacitor may be disposed on the top of the inductor, the input terminal may be formed on a first end surface of the magnetic body and formed of a third external electrode connected to the coil unit, the output terminal may include a first output terminal formed of a fourth external electrode connected to the coil unit and a second output terminal formed of a combination of a second external electrode formed on a second lateral surface of the ceramic body and electrically connected to the second internal electrodes and a second dummy electrode formed on a second lateral surface of the magnetic body, and the ground terminal may be formed of a combination of a first external electrode formed on a first lateral surface of the ceramic body and electrically connected to the first internal electrodes and the first dummy electrode formed on a first lateral surface of the magnetic body.

The inductor may be disposed on the top of the capacitor, the input terminal may be formed of a first dummy electrode formed on a first end surface of the ceramic body and a third external electrode formed on the first end surface of the magnetic body and connected to the coil unit, the output terminal may include a first output terminal formed of a combination of a second dummy electrode formed on a second end surface of the ceramic body and a fourth external electrode formed on a second end surface of the magnetic body and connected to the coil unit and a second output terminal formed of a second external electrode formed on the second lateral surface of the ceramic body and electrically connected to the second internal electrodes, and the ground terminal may be formed of a first external electrode formed on the first lateral surface of the ceramic body and electrically connected to the first internal electrodes.

According to another aspect of the present disclosure, a board having a composite electronic component mounted thereon may include: a printed circuit board (PCB) having three or more electrode pads formed on an upper surface thereof; the composite electronic component installed on the PCB; and solder connecting the electrode pads and the composite electronic component.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Figure 1:
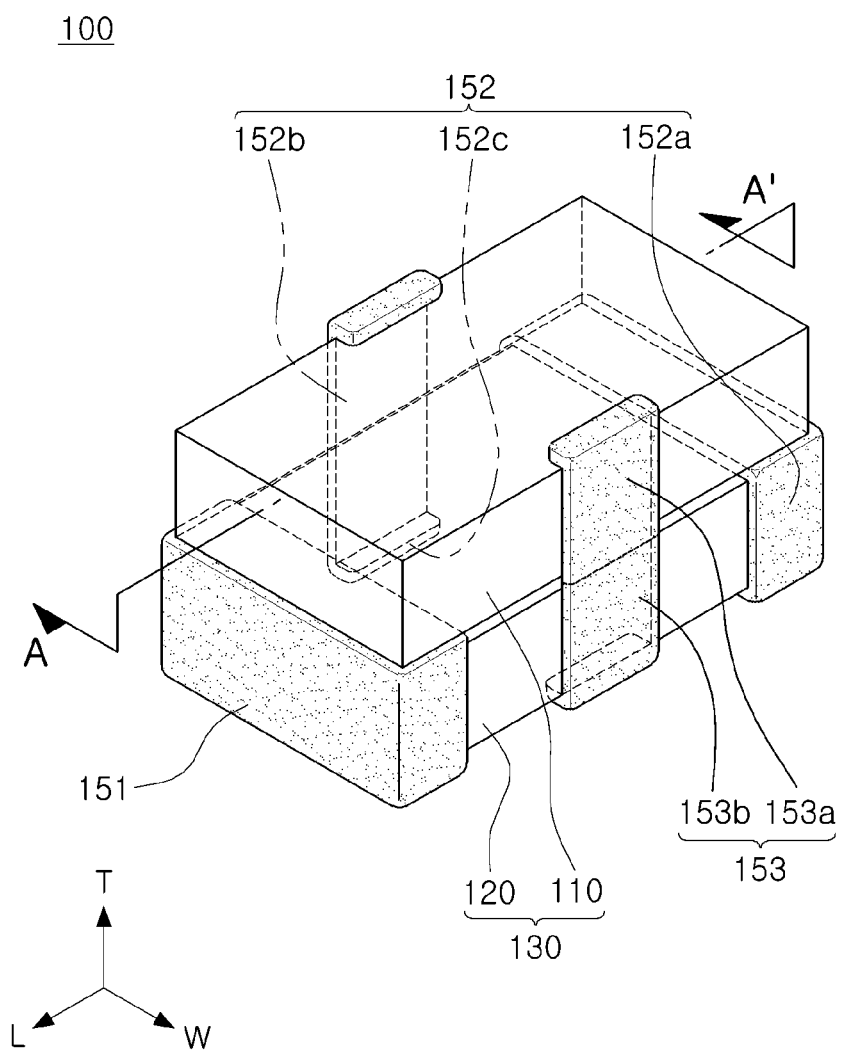
FIG. 1 is a perspective view schematically illustrating a composite electronic component according to an exemplary embodiment of the present disclosure.

Hereinafter, exemplary embodiments of the present disclosure will be described in detail with reference to the accompanying drawings.

The disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

In the drawings, the shapes and dimensions of elements may be exaggerated for clarity, and the same reference numerals will be used throughout to designate the same or like elements.

Composite Electronic Component

Hereinafter, exemplary embodiments of the present disclosure will be described with reference to the accompanying drawings.

FIG. 1 is a perspective view schematically illustrating a composite electronic component according to an exemplary embodiment of the present disclosure.

Figure 2:
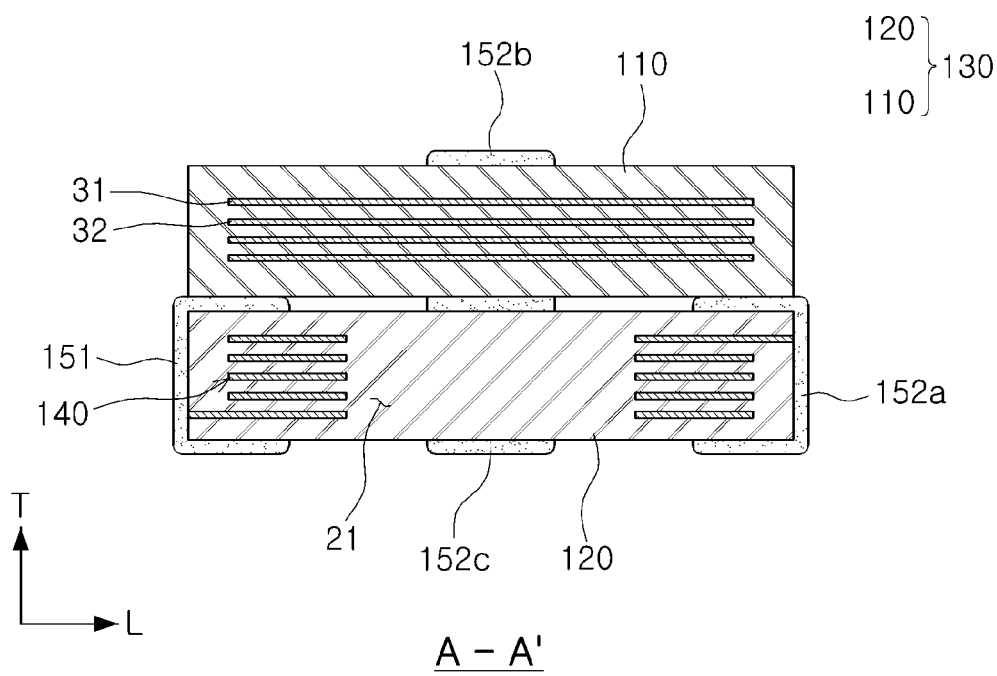
FIG. 2 is a cross-sectional view illustrating a first example of the composite electronic component of FIG. 1 taken along line A-A'.

FIG. 2 is a cross-sectional view illustrating a first example of the composite electronic component of FIG. 1 taken along line A-A'.

Figure 3:
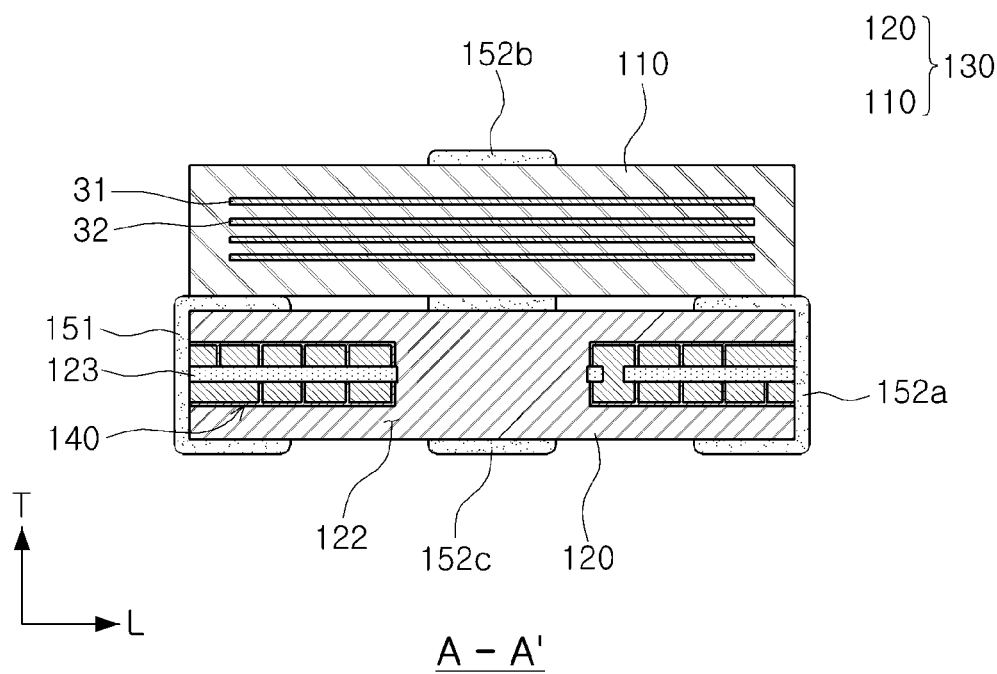
FIG. 3 is a cross-sectional view illustrating a second example of the composite electronic component of FIG. 1 taken along line A-A'.

FIG. 3 is a cross-sectional view illustrating a second example of the composite electronic component of FIG. 1 taken along line A-A'.

Figure 4:
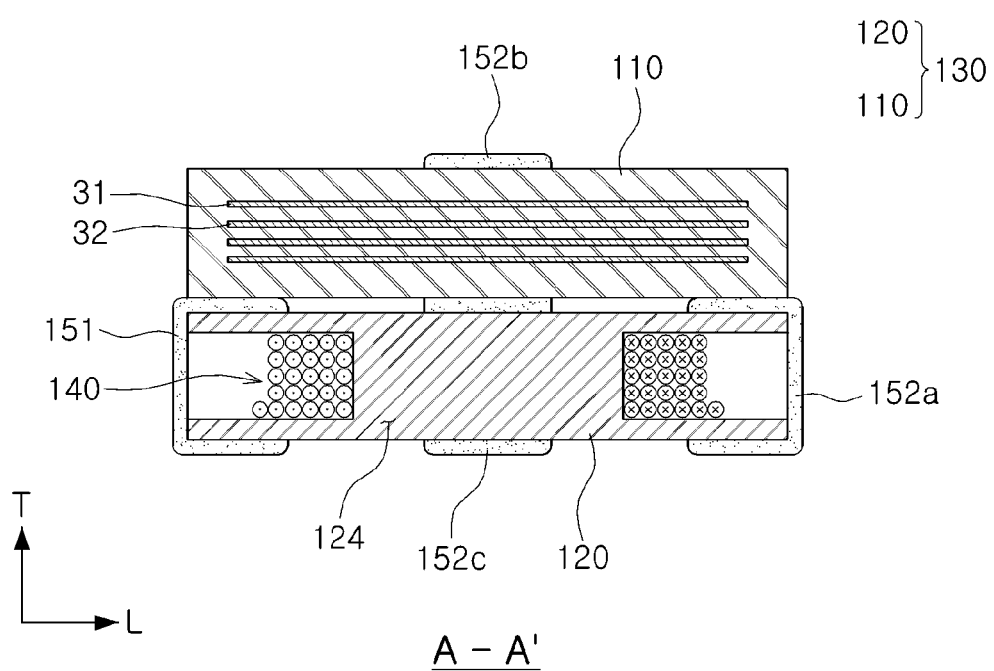
FIG. 4 is a cross-sectional view illustrating a third example of the composite electronic component of FIG. 1 taken along line A-A'.

FIG. 4 is a cross-sectional view illustrating a third example of the composite electronic component of FIG. 1 taken along line A-A'.

Figure 5:
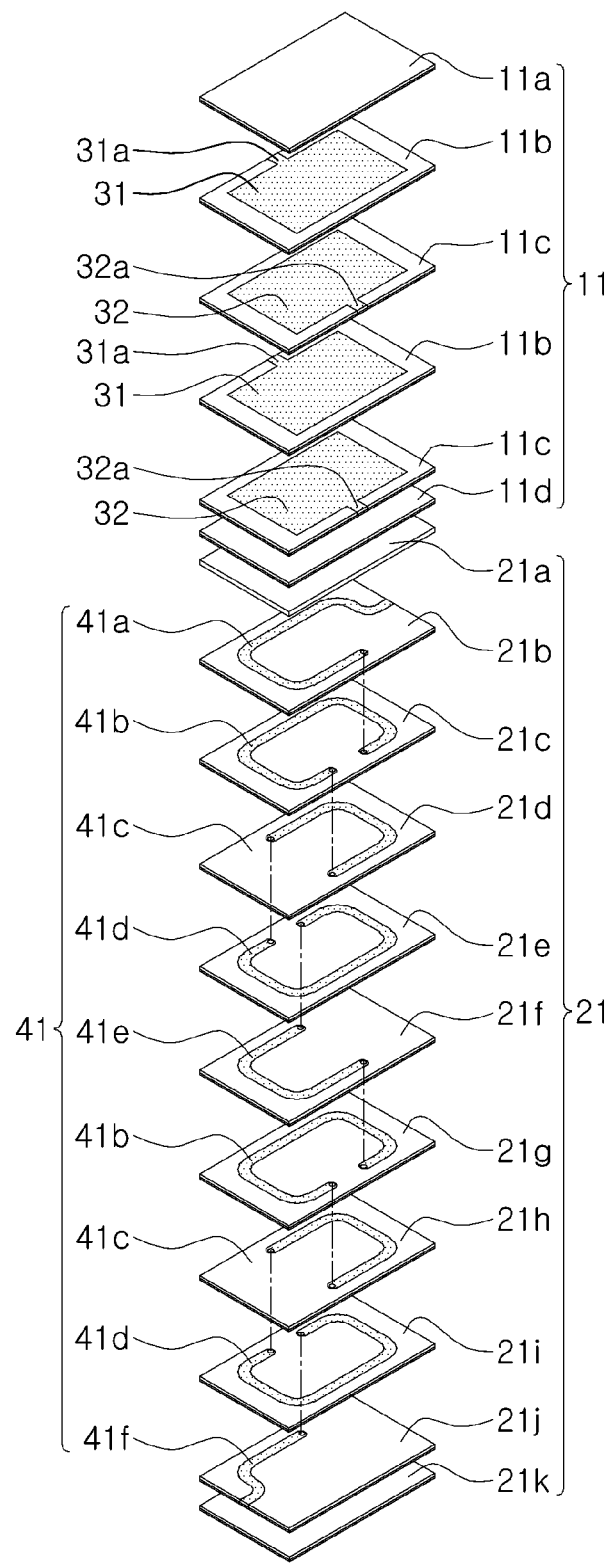
FIG. 5 is an exploded perspective view schematically illustrating a laminated configuration of the composite electronic component of FIG. 1 according to an exemplary embodiment of the present disclosure.

FIG. 5 is an exploded perspective view schematically illustrating a laminated configuration of the composite electronic component of FIG. 1 according to an exemplary embodiment of the present disclosure.

Figure 6:
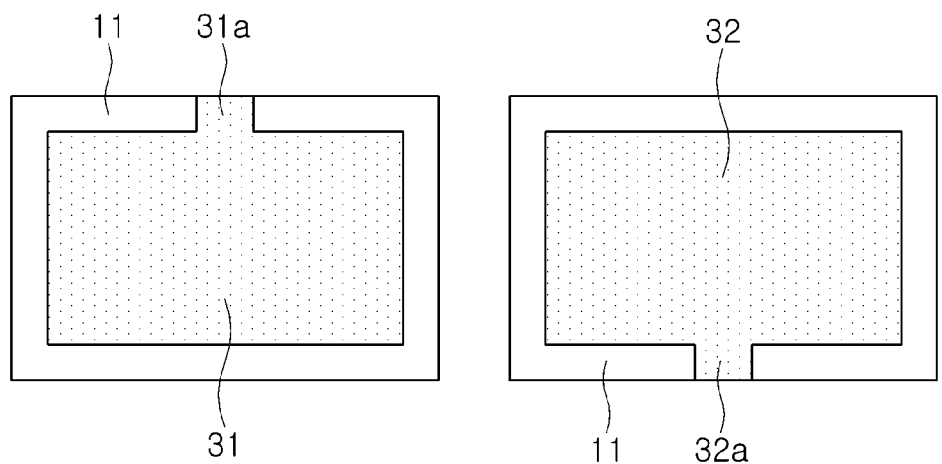
FIG. 6 is a plan view illustrating an internal electrode employable in a multilayer ceramic capacitor included in the composite electronic component illustrated in FIG. 1.

FIG. 6 is a plan view illustrating an internal electrode employable in a multilayer ceramic capacitor included in the composite electronic component illustrated in FIG. 1.

Referring to FIG. 1, in the composite electronic component according to an exemplary embodiment of the present disclosure, it is defined that a 'length direction' is 'L', a 'width direction' is and a 'thickness direction' is 'T' in FIG. 1. Here, the 'thickness direction' may be used as having the same concept as a 'lamination direction' in which dielectric layers of a capacitor are laminated.

Meanwhile, as described hereinafter, it is defined that length, width, and thickness directions of the composite electronic component are identical to length, width, and thickness directions of a capacitor and an inductor.

Also, in an exemplary embodiment of the present disclosure, the composite electronic component may have upper and lower surfaces opposing one another, and first and second lateral surfaces and first and second end surfaces connecting the upper and lower surfaces. A shape of the composite electronic component is not particularly limited, and as illustrated, the composite electronic component may have a hexahedral shape.

Also, the first and second lateral surfaces and first and second end surfaces of the composite electronic component will be defined as being identical to the first and second lateral surfaces and first and second end surfaces of a capacitor and an inductor in the same directions.

Meanwhile, the composite electronic component is a combination of a capacitor and an inductor, and in a case in which a capacitor is combined on the top of an inductor, an upper surface of the composite electronic component may be defined as an upper surface of the capacitor and a lower surface of the composite electronic component may be defined as a lower surface of the inductor.

Conversely, in a case in which an inductor is combined on the top of a capacitor, an upper surface of the composite electronic component may be defined as an upper surface of the inductor and a lower surface of the composite electronic component may be defined as a lower surface of the capacitor.

Also, first and second lateral surfaces correspond to surfaces of the composite electronic component opposing one another in the width direction, first and second end surfaces correspond to surfaces of the composite electronic component opposing one another in the length direction, and the upper and lower surfaces correspond to surfaces of the composite electronic component opposing one another in the thickness direction.

Referring to FIGS. 1 through 6, a composite electronic component 100 according to an exemplary embodiment of the present disclosure includes a composite body 130 including a combination of a capacitor 110 formed of a ceramic body in which a plurality of dielectric layers 11 and internal electrodes 31 and 32 are laminated such that the internal electrodes are disposed to face each other with the dielectric layers 11 interposed therebetween and an inductor 120 formed of a magnetic body including a coil unit 140.

In the present exemplary embodiment, the composite body 130 has upper and lower surfaces opposing one another, and first and second lateral surfaces and first and second end surfaces connecting the upper and lower surfaces.

The composite body 130 may have a hexahedral shape as illustrated, but the present disclosure is not limited thereto.

The hexahedral composite body 130 may be formed by combining the capacitor 110 and the inductor 120, and here, a method of forming the composite body 130 is not particularly limited.

For example, the composite body 130 may be formed by combining separately manufactured capacitor 110 and inductor 120 with a conductive adhesive, a resin, or the like, or by sequentially stacking the magnetic body of the inductor 120 and the ceramic body of the capacitor 110, without being particularly limited.

Meanwhile, according to the present exemplary embodiment, the capacitor 110 may be disposed on the top of the inductor 120.

Thus, transmission of vibrations of the capacitor 110 due to inverse-piezoelectricity of the capacitor 110 may be reduced to reduce acoustic noise.

Details of the structure of reducing acoustic noise when the composite electronic component 100 is mounted on a board will be described hereinafter.

Hereinafter, the capacitor 110 and the inductor 120 constituting the composite body 130 will be described in detail.

According to the present exemplary embodiment, the magnetic body constituting the inductor 120 may include the coil unit 140.

The inductor 20 may be, for example, a laminated-type inductor, a thin film-type inductor, or a winding-type inductor, without being particularly limited. In addition, a laser helixing-type inductor, or the like, may also be used.

The laminated-type inductor refers to an inductor manufactured by printing a thick electrode on a thin ferrite or glass ceramic sheet, stacking several layers of sheets with coil patterns printed thereon, and connecting internal conducting wires through via holes.

The thin film-type inductor refers to an inductor manufactured by forming coil conducting wires on a ceramic substrate through thin film sputtering or plating, and filling the interior with a ferrite material.

The winding-type inductor refers to an inductor manufactured by winding a line material (coil conducting wire) around a core.

The laser helixing-type inductor refers to an inductor manufactured by forming an electrode layer on a ceramic bobbin through sputtering or plating, shaping a coil by laser helixing, and subsequently processing the coil into a terminal with an external protective film resin.

Referring to FIG. 2, in a composite electronic component according to a first exemplary embodiment of the present disclosure, the inductor 120 may be a laminated-type inductor.

In detail, the magnetic body may have a configuration in which a plurality of magnetic layers 21 respectively having a conductive pattern 41 formed thereon are laminated, and the conductive patterns 41 form the coil unit 40.

Referring to FIG. 3, in a composite electronic component according to a second exemplary embodiment of the present disclosure, the inductor 120 may be a thin film-type inductor.

In detail, the inductor 120 may a thin film type inductor in which the magnetic body includes an insulating substrate 123 and a coil formed on at least one surface of the insulating substrate 123.

The magnetic body may be formed by filling upper and lower portions of the insulating substrate 123 having the coil formed on at least one surface thereof with a magnet 122.

Referring to FIG. 4, in a composite electronic component according to a third exemplary embodiment of the present disclosure, the inductor 20 may be a winding-type inductor.

In detail, the magnetic body of the inductor 120 may include a core 124 and a coil wound around the core 124.

The magnetic layers and the magnet 122 are formed of a Ni—Cu—Zn-based, Ni—Cu—Zn—Mg-based, Mn—Zn-based, or ferrite-based material, but the present disclosure is not limited thereto.

According to an exemplary embodiment, the inductor 120 may be a power inductor applicable to a high current.

The power inductor is an efficient inductor whose inductance is changed less than that of a general inductor when a DC is applied thereto. Namely, the power inductor may be considered an inductor having even DC bias characteristics (a change in inductance when a DC is applied) in addition to a function of a general inductor.

Namely, the composite electronic component according to the exemplary embodiment of the present disclosure, which is used in a power management integrated circuit (PMIC), may include an efficient power inductor whose inductance is rarely changed when a DC is applied thereto, rather than a general inductor.

Hereinafter, the case in which the inductor 120 is a laminated-type inductor according to the first exemplary embodiment, among the first to third exemplary embodiments, in the composite electronic component will be described in detail.

The magnetic body may be manufactured by printing conductive patterns 41 on magnetic green sheets 21b to 21j, laminating the plurality of magnetic green sheets 21b to 21j with the conductive patterns 41 formed thereon, laminating magnetic green sheets 21a and 21k in upper and lower sides thereof, and subsequently sintering the resultant structure.

The magnet may be formed of a Ni—Cu—Zn-based, Ni—Cu—Zn—Mg-based, Mn—Zn-based, or ferrite-based material, but the present disclosure is not limited thereto.

Referring to FIG. 5, after the conductive patterns 41 are printed on the magnetic green sheets 21b to 21j and dried, the magnetic green sheets 21a and 21k are laminated in upper and lower sides thereof to form a magnetic body.

As for the conductive patterns 41 within the magnetic body, the plurality of conductive patterns 41a to 41f may be laminated to form coil patterns in a lamination direction.

The conductive patterns 41 may be formed by printing a conductive paste including silver (Ag) as a main ingredient with a predetermined thickness.

The conductive patterns 41 may be electrically connected to third and fourth external electrodes 151 and 152a formed in both end portions in a length direction and constituting input and output terminals 151 and 152.

The conductive patterns 41 may have lead out portions electrically connected to the third and fourth external electrodes 151 and 152a constituting the input and output terminals 151 and 152.

One conductive pattern 41a among the conductive patterns 41 may be electrically connected to another conductive pattern 41b disposed with the magnetic layer 21 interposed therebetween through a via electrode formed on the magnet 21b, and has a coil pattern in the lamination direction.

In the exemplary embodiment of the present disclosure, the coil pattern is not particularly limited and may be designed according to capacity of the inductor.

Namely, the second to fifth conductive patterns 41b to 41e may be laminated in a coil form between the first conductive pattern 41a having a lead out portion exposed to a second end surface and the sixth conductive pattern 41f having a lead out portion exposed to a first end surface of the composite body, and the conductive patterns may be connected by the via electrodes formed on each magnet, respectively, as described above.

In FIG. 5, it is illustrated that the second to fifth conductive patterns 41b to 41e are repeated in pairs, but the present disclosure is not limited thereto and the number of the conductive patterns is not limited according to the purpose of the present disclosure.

Meanwhile, the ceramic body constituting the capacitor 110 may be formed by laminating a plurality of dielectric layers 11a to 11d, and a plurality of internal electrodes 31 and 32 (first and second internal electrodes, sequentially) may be separately disposed with the dielectric layer interposed therebetween within the ceramic body.

The dielectric layers 11 may be formed by firing a ceramic green sheet including ceramic powder, an organic solvent, and an organic binder. The ceramic powder may be formed of a barium titanate ($BaTiO_3$)-based material, a strontium titanate ($SrTiO_3$)-based material as a material having a high permittivity (dielectric constant), but the present disclosure is not limited thereto.

Meanwhile, according to the exemplary embodiment of the present disclosure, the internal electrodes may include a first internal electrode 31 having a lead out portion 31a exposed to the first lateral surface of the composite body 130 and a second internal electrode 32 having a lead out portion 32a exposed to the second lateral surface of the composite body 30, but the present disclosure is not limited thereto.

In detail, the ceramic body constituting the capacitor 110 may be formed by laminating the plurality of dielectric layers 11a to 11d.

The first and second internal electrodes 31 and 32 may be formed on a portion of dielectric layers 11b and 11c, among the plurality of dielectric layers 11a to 11d, so as to be laminated.

According to the exemplary embodiment of the present disclosure, the first and second internal electrodes 31 and 32 may be formed of a conductive paste including a conductive metal.

The conductive metal may be a nickel (Ni), copper (Cu), palladium (Pd), or alloys thereof, but the present disclosure is not limited thereto.

The first and second internal electrodes 31 and 32 may be formed by printing a conductive paste on each ceramic green sheet forming the dielectric layer 11 through a printing method such as a screen printing method or a gravure printing method.

The ceramic green sheets with the internal electrodes printed thereon may be alternately laminated and fired to form the ceramic body.

In FIG. 6, pattern shapes of the first and second internal electrodes 31 and 32 are illustrated, but the present disclosure is not limited thereto and the pattern shapes of the first and second internal electrodes 31 and 32 may be variously modified.

The capacitor may serve to adjust a voltage supplied from a power management unit (or the PMIC).

According to the exemplary embodiment of the present disclosure, the capacitor 110 may include a first external electrode 153a formed on the first lateral surface of the ceramic body and electrically connected to the first internal electrodes 31 and a second external electrode 152b formed on the second lateral surface and electrically connected to the second internal electrodes 32, and the inductor 120 may include third and fourth external electrodes 151 and 152a formed on the first and second end surfaces of the magnetic body and connected to the coil unit 140 and first and second dummy electrodes 153b and 152c formed on the first and second lateral surfaces of the magnetic body.

The capacitor 110 may include the first external electrode 153a formed on the first lateral surface of the ceramic body and electrically connected to the first internal electrodes 31 and the second external electrode 152b formed on the second lateral surface and electrically connected to the second internal electrodes 32.

The first external electrode 153a is formed on the first lateral surface of the ceramic body, but it may also extend to upper and lower surfaces of the ceramic body so as to be formed.

The second external electrode 152b is formed on the second lateral surface of the ceramic body, but it may also extend to upper and lower surfaces of the ceramic body so as to be formed.

Also, the inductor 120 may include the third and fourth external electrodes 151 and 152a formed on the first and second end surfaces of the magnetic body and connected to the coil unit 140 and the first and second dummy electrodes 153b and 152c formed on the first and second lateral surfaces of the magnetic body.

The third and fourth external electrodes 151 and 152a are formed on the first and second end surfaces of the magnetic body, but they may also extend to the upper and lower surfaces and first and lateral surfaces of the magnetic body so as to be formed.

Also, the first dummy electrode 153b is formed on the first lateral surface of the magnetic body, but it may also extend to the upper and lower surfaces of the magnetic body so as to be formed.

The second dummy electrode 152c is formed on the second lateral surface of the magnetic body, but it may also extend to the upper and lower surfaces of the magnetic body so as to be formed.

Meanwhile, according to the present exemplary embodiment, the third external electrode 151 of the inductor 120 may form an input terminal 151 of the composite electronic component.

Also, the fourth external electrode 152a of the inductor 120 may form a first output terminal of the composite electronic component, and the second dummy electrode 152c of the inductor 120 and the second external electrode 152b of the capacitor 110 may be combined to form a second output terminal of the composite electronic component, whereby the output terminals 152 including the first output terminal and the second output terminal.

Also, the first dummy electrode 153b of the inductor 120 and the first external electrode 153a of the capacitor 110 may be combined to form a ground terminal 153 of the composite electronic component.

The second dummy electrode 153c of the inductor and the second external electrode 152b of the capacitor 110 constituting the second output terminal may be combined by a conductive adhesive, but the present disclosure is not particularly limited thereto.

The first dummy electrode 153b of the inductor 120 and the first external electrode 153a of the capacitor 110 constituting the ground terminal 153 of the composite electronic component may be combined by a conductive adhesive, but the present disclosure is not limited thereto.

The conductive adhesive may not be particularly limited and may be, for example, a conductive epoxy paste.

A plated layer (not shown) may be formed on the input terminal 151, the output terminal 152, and the ground terminal 153.

In this case, the plated layer is formed after the capacitor 110 is bonded to inductor 120 by a conductive adhesive. Thus, the plated layer may only be formed on the exposed terminals and may not be formed on the first and second dummy electrodes 153b and 152c formed on upper surface of the inductor 120 and the first and second external electrodes 153a and 152b formed on a lower surface of the capacitor 110.

The input terminal 151 and the output terminal 152 may be connected to the coil unit 40 of the inductor 120 to serve as an inductor within the composite electronic component.

Also, the output terminal 152b may be connected to the second internal electrode 32 of the capacitor 110, and the first internal electrode 31 of the capacitor 110 may be connected to the ground terminal 153 to serve as the capacitor within the composite electronic component.

The input terminal 151, the output terminal 152, and the ground terminal 153 may be formed of a conductive paste including a conductive metal.

The conductive metal may be nickel (Ni), copper (Cu), tin (Sn), or alloys thereof, but the present disclosure is not limited thereto.

The conductive paste may further include an insulating material, and here, the insulating material may be, for example, glass, but the present disclosure is not limited thereto.

A method of forming the input terminal 151, the output terminal 152, and the ground terminal 153 is not particularly limited. Namely, the input terminal 151, the output terminal 152, and the ground terminal 153 may be formed by dipping the ceramic body or by using any other method such as plating, or the like.

Figure 7:
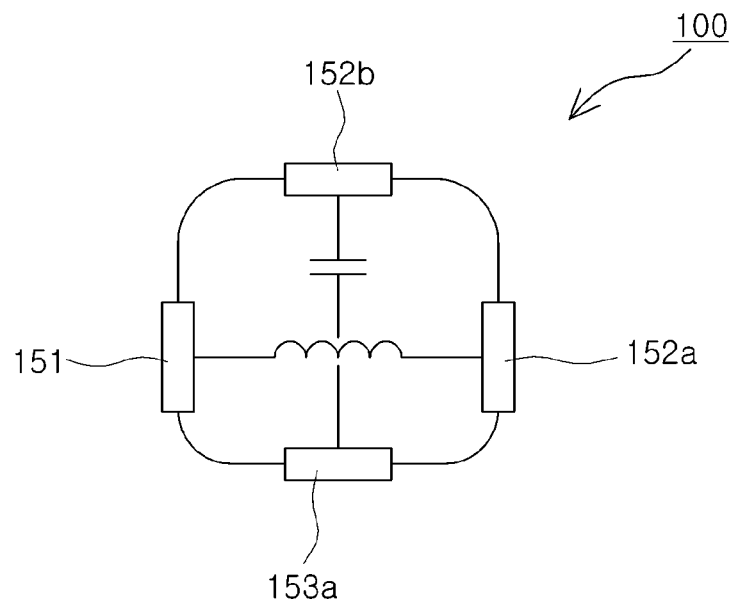
FIG. 7 is an equivalent circuit diagram of the composite electronic component illustrated in FIG. 1.

FIG. 7 is an equivalent circuit diagram of the composite electronic component illustrated in FIG. 1.

Referring to FIG. 7, unlike the related art, in the composite electronic component according to the exemplary embodiment of the present disclosure, the inductor 120 and the capacitor 110 are combined, so the inductor 120 and the capacitor 110 may be designed to have a shortest distance therebetween, thus reducing noise.

In addition, since the inductor 120 and the capacitor 110 are combined, a mounting area in the power management unit may be minimized, advantageously securing a mounting space.

Also, mounting costs may be reduced.

Also, in the composite electronic component, since the capacitor 110 is formed on the inductor 120, transmission of vibrations of the capacitor 110 due to inverse-piezoelectricity of the capacitor 110 when the composite electronic component is mounted on a board may be reduced to reduce acoustic noise.

Also, since a bonding unit of the inductor and the capacitor is a conductive resin layer, damage such as cracks generated in the capacitor due to mechanical stress such as thermal shock, or the like, may be prevented.

Figure 8:
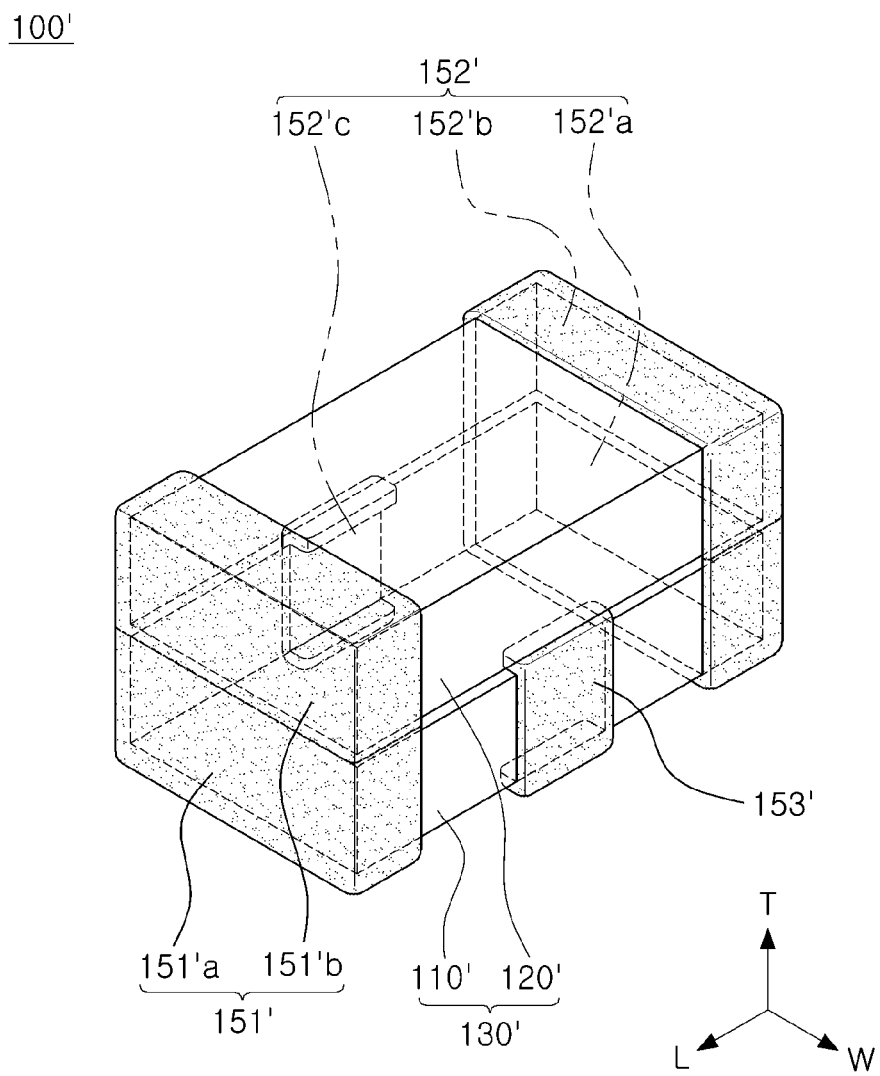
FIG. 8 is a perspective view schematically illustrating a composite electronic component according to another exemplary embodiment of the present disclosure.

FIG. 8 is a perspective view schematically illustrating a composite electronic component according to another exemplary embodiment of the present disclosure.

Referring to FIG. 8, a composite electronic component 100' according to another exemplary embodiment of the present disclosure may include a composite body 130' including a combination of a capacitor 110' formed of a ceramic body including a plurality of dielectric layers and first and second internal electrodes disposed to face one another with the dielectric layers interposed therebetween, the first internal electrodes respectively having a lead out portion exposed to a first lateral surface and the second internal electrodes respectively having a lead out portion exposed to a second lateral surface, and an inductor 120' formed of a magnetic body including a coil unit; a first external electrode 153' formed on the first lateral surface of the ceramic body and electrically connected to the first internal electrodes, a second external electrode 153'c formed on the second lateral surface of the ceramic body and electrically connected to the first internal electrodes, and first and second dummy electrodes 151'a and 152'a formed on the first and second end surfaces of the ceramic body; and third and fourth external electrodes 151'b and 152'b formed on first and second end surfaces of the magnetic body and connected to the coil unit, wherein the inductor 120' is disposed on the top of the capacitor 110', and the composite body 130' may include an input terminal 151' formed of a combination of the first dummy electrode 151'a and the third external electrode 151'b, an output terminal 152' including a first output terminal formed of a combination of the second dummy electrode 152'a and the fourth external electrode 152'b and a second output terminal formed of the second external electrode 152'c, and a ground terminal 153' formed of the first external electrode 153'.

The magnetic body may be configured by laminating a plurality of magnetic layers respectively having a conductive pattern thereon.

The inductor 120' may be a thin film type inductor in which the magnetic body includes an insulating substrate and a coil formed on at least one surface of the insulating substrate.

The magnetic core may include a core and a winding coil wound around the core.

The inductor 120' may be a power inductor.

The capacitor 110' and the inductor 120' may be connected by a conductive adhesive.

The capacitor 110' may include the first external electrode 153' formed on the first lateral surface of the ceramic body and electrically connected to the first internal, the second external electrode 152'c formed on the second lateral surface and electrically connected to the second internal electrode, and the first and second dummy electrodes 151'a and 152'a formed on the first and second end surfaces of the ceramic body.

The first external electrode 153' is formed on the first lateral surface of the ceramic body and may extend to upper and lower surfaces of the ceramic body so as to be formed.

The second external electrode 152'c is formed on the second lateral surface of the ceramic body and may extend to the upper and lower surfaces of the ceramic body so as to be formed.

The first and second dummy electrodes 151'a and 152'a are formed on the first and second end surfaces of the ceramic body and may extend to upper and lower surfaces and first and second lateral surfaces of the ceramic body so as to be formed.

Namely, the capacitor 110' included in the composite electronic component 100' according to another exemplary embodiment of the present disclosure may be a 4-terminal capacitor including the first external electrode 153', the second external electrode 152'c, and the first and second dummy electrodes 151'a and 152'a.

Also, the inductor 120 may include the third and fourth external electrode 151'b and 152'b formed on the first and second end surfaces of the magnetic body and connected to the coil unit.

The third and fourth external electrode 151'b and 152'b are formed on the first and second end surfaces of the magnetic body and may extend to the upper and lower surfaces and first and second lateral surfaces of the magnetic body so as to be formed.

The first dummy electrode 151'a of the capacitor and the third external electrode 151'b of the inductor 120' may be combined to form the input terminal 151' of the composite electronic component 100'.

Also, the second dummy electrode 152'a of the capacitor 110' and the fourth external electrode 152b' of the inductor 120' may be combined to form the first output terminal of the composite electronic component 100', and the second external electrode 152'c of the capacitor 110' forms the second output terminal of the composite electronic component 100', thus forming the output terminal 152' including the first output terminal and the second output terminal.

Meanwhile, the first external electrode 153' of the capacitor 110' may form the ground terminal 153' of the composite electronic component 100'.

The first dummy electrode 151'a of the capacitor 110' and the third external electrode 151'b of the inductor 120' may be combined by a conductive adhesive, but the present disclosure is not limited thereto.

Also, the second dummy electrode 152'a of the capacitor 110' and the fourth external electrode 152'b of the inductor 120' may be combined by a conductive adhesive, but the present disclosure is not limited thereto.

Descriptions of characteristics of the composite electronic component 100' according to present exemplary embodiment identical to those of the composite electronic component 100 according to the former exemplary embodiment of the present disclosure will be omitted in order to avoid redundancy.

Figure 9:
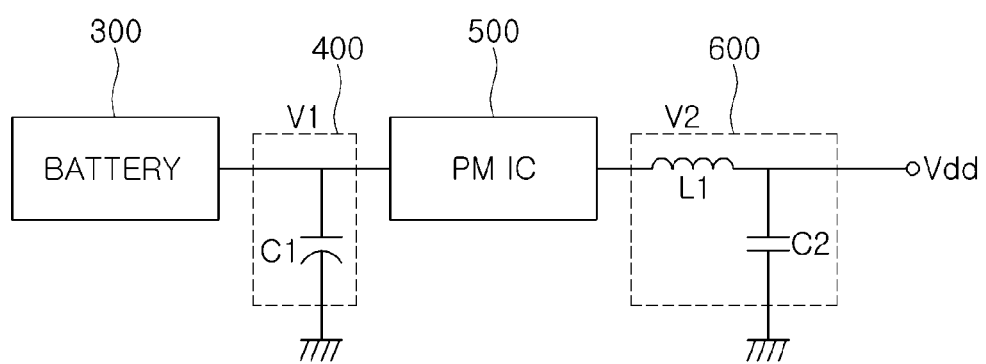
FIG. 9 is a view illustrating a driving power supply system supplying driving power through a battery and a power management unit to a predetermined terminal requiring driving power according to an exemplary embodiment of the present disclosure.

FIG. 9 is a view illustrating a driving power supply system supplying driving power through a battery and a power management unit to a predetermined terminal requiring driving power according to an exemplary embodiment of the present disclosure.

Referring to FIG. 9, the driving power supply system may include a battery 300, a first power smoothing unit 400, a power management unit 500 (or power management integrated circuit (PMIC), and a second power smoothing unit 600.

The battery 300 may supply power to the power management unit 500. Here, power supplied by the battery 300 to the power management unit 500 is defined as first power.

The first power smoothing unit 400 may smooth the first power V1 and supply the smoothed first power to the power management unit 500. In detail, the first power smoothing unit 400 may include a capacitor C1 formed between connection terminals of the battery 300 and the power management unit 500 and a ground. The capacitor C1 may reduce noise included in the first power.

Also, the capacitor C1 may charge electric charges. In a case in which the power management unit 500 instantaneously consumes a high current, the capacitor C1 may discharge charged electric charges to suppress voltage fluctuations of the power management unit 500.

The capacitor C1 may be a capacitor having high capacitance and including 300 or more dielectric layers.

The power management unit 500 serves to convert power introduced to an electronic device into a form fitting the electronic device, and distribute, charge, and control power. Thus, in general, the power management unit 500 may include a DC/DC converter.

Also, the power management unit 500 may be implemented as a power management integrated circuit (PMIC).

The power management unit 500 may convert the first power V1 into second power V2. The second power V2 may be power requested by an active element such as an IC, or the like, that is connected to an output terminal of the power management unit 500 to receive driving power.

The second power smoothing unit 600 may smooth the second power V2 and deliver the smoothed second power to an output terminal Vdd. An active element such as IC, or the like, that is provided with driving power from the power management unit 500 may be connected to the output terminal Vdd.

In detail, the second power smoothing unit 600 may include an inductor L1 connected in series between the power management unit 500 and the output terminal Vdd. Also, the second power smoothing unit 600 may include a capacitor C2 formed between connection terminals of the power management unit 500 and the output terminal Vdd and a ground.

The second power smoothing unit 600 may reduce noise included in the second power V2.

Also, the second power smoothing unit 600 may stably supply power to the output terminal Vdd.

The inductor L1 may be a power inductor applicable to a high current.

The power inductor may be an efficient inductor whose inductance is changed less than that of a general inductor when a DC is applied thereto. Namely, the power inductor may be considered an inductor having even DC bias characteristics (a change in inductance when a DC is applied) in addition to a function of a general inductor.

Also, the capacitor C2 may be a capacitor having high capacitance.

Figure 10:
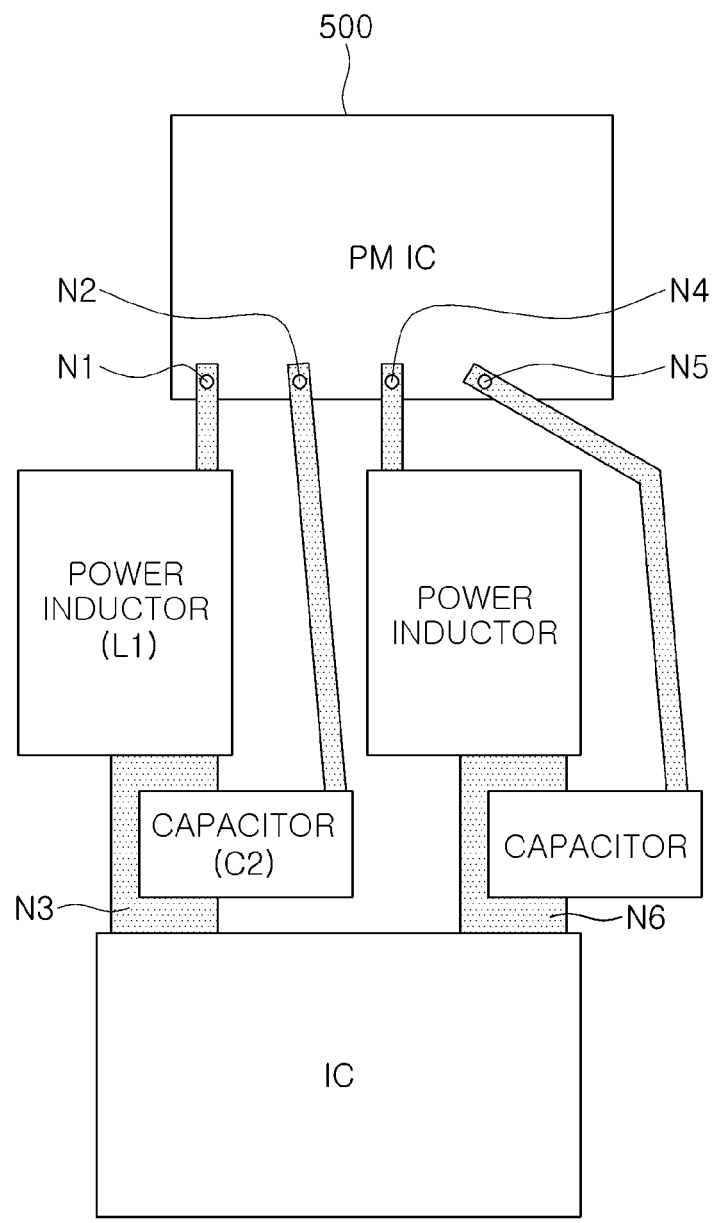
FIG. 10 is a view illustrating a layout pattern of the driving power supply system.

FIG. 10 is a view illustrating a layout pattern of the driving power supply system.

Referring to FIG. 10, a layout pattern of the power management unit 500, the power inductor L1, and the second capacitor C2 may be recognized.

In general, the power management unit 500 (or PMIC) may have a few to tens of DC/DC converters. Also, in order to implement functions of the DC/DC converters, each of the DC/DC converters requires a power inductor and a high capacity capacitor (i.e., a capacitor having high capacitance).

Referring to FIG. 10, the power management unit 500 may include predetermined terminals N1 and N2. The power management unit 500 may receive power from the battery and convert the power by using the DC/DC converters. Also, the power management unit 500 may supply converted power through the first terminal N1. The second terminal N2 may be a ground terminal.

Here, the first power inductor L1 and the second capacitor C2 may receive power from the first terminal N1, smooth the received power, and supply driving power through the third terminal N3, thus performing the function of the second power smoothing unit.

Fourth to sixth terminals N4 to N6 illustrated in FIG. 10 perform functions identical to those of the first to third terminals N1 to N3, so detailed descriptions thereof will be omitted.

To be considered important in designing a pattern of the driving power supply system is that the power management unit, the power inductor, and the high capacity capacitor need to be disposed as close as possible. Also, wiring of a power line needs to be designed to be short and thick.

This is due to the fact that a component layout area may be reduced and noise generation may be suppressed when such requirements are met.

In a case in which the number of output terminals of the power management unit 500 is small, there is no problem in disposing the power inductor and the high capacity capacitor to be close. However, if several outputs of the power management unit 500 are to be used, the power inductor and the high capacity capacitor may not be properly disposed due to component compactness. Also, the power inductor and the high capacity capacitor may be disposed in a non-optimized state according to priority of power.

For example, since the power inductor and the high capacity capacitor have a large size, a power line and a signal line may inevitably be lengthened when elements are actually disposed.

In a state in which the power inductor and the high capacity capacitor are disposed in a non-optimized state, intervals between respective elements and power lines are lengthened, generating noise which may negatively affect the power supply system.

Figure 11:
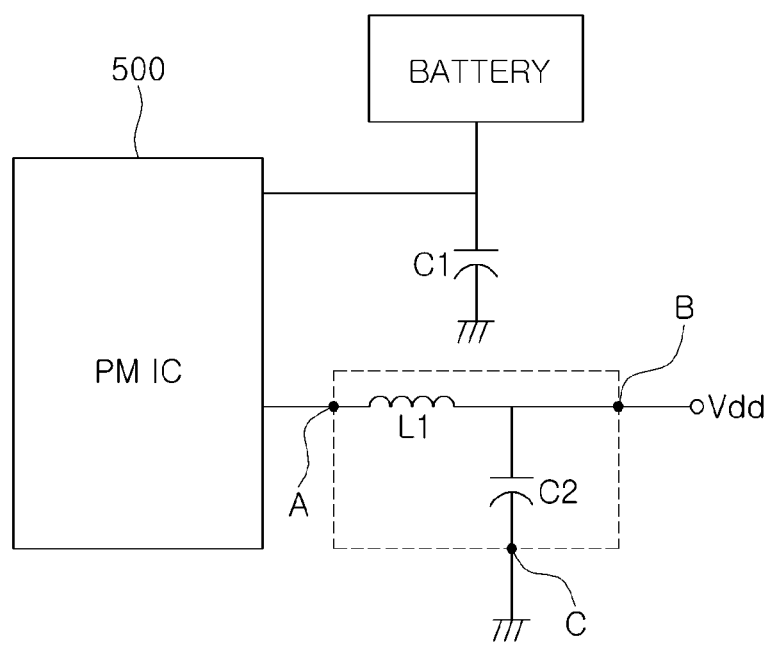
FIG. 11 is a circuit diagram of a composite electronic component according to an exemplary embodiment of the present disclosure.

FIG. 11 is a circuit diagram of a composite electronic component according to an exemplary embodiment of the present disclosure.

Referring to FIG. 11, a composite electronic component 700 may include an input terminal A, a power smoothing unit, an output terminal B, and a ground terminal C.

The power smoothing unit may include a power inductor L1 and a second capacitor C2.

The composite electronic component 700 may be an element serving as the second power smoothing unit as described above.

The input terminal A may receive power which has been converted by the power management unit 500.

The power smoothing unit may smooth power received from the input terminal A.

The output terminal B may supply smoothed power to the output terminal Vdd.

The ground terminal C may connect the power smoothing unit to a ground.

Meanwhile, the power smoothing unit includes the power inductor L1 connected between the input terminal A and the output terminal B and the second capacitor C2 connected between the ground terminal C and the output terminal B.

Referring to FIG. 11, since the power inductor L1 and the second capacitor C2 share the output terminal B, a space between the power inductor L1 and the capacitor C2 may be reduced.

In this manner, in the composite electronic component 700, the power inductor and the high capacity capacitor provided in an output power terminal of the power management unit 500 are implemented as a single component. Thus, the composite electronic component 700 has enhanced element integration.

Figure 12:
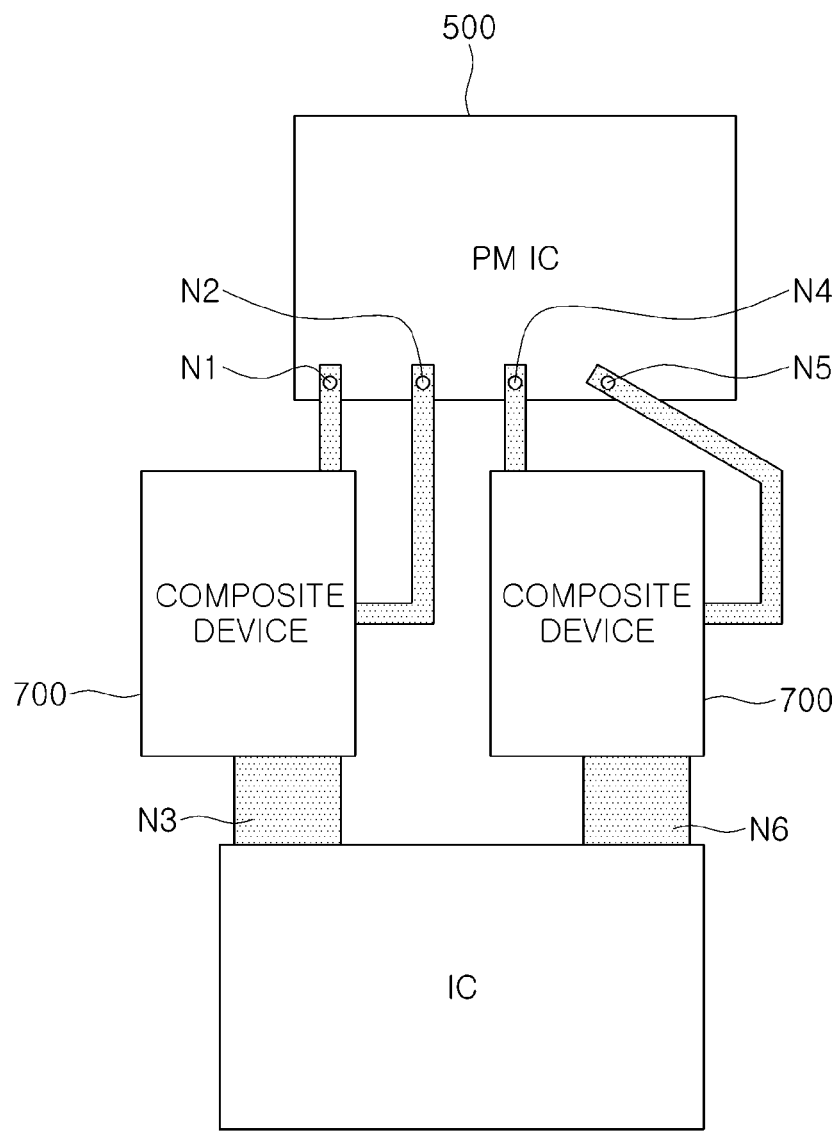
FIG. 12 is a view illustrating a layout pattern of a driving power supply system employing a composite electronic component according to an exemplary embodiment of the present disclosure.

FIG. 12 is a view illustrating a layout pattern of a driving power supply system employing a composite electronic component according to an exemplary embodiment of the present disclosure.

Referring to FIG. 12, it can be seen that the second capacitor C2 and the power inductor L1 illustrated in FIG. 10 are replaced with a composite electronic component according to the exemplary embodiment of the present disclosure.

As discussed above, the composite electronic component may serve as the second power smoothing unit.

Also, by replacing the second capacitor C1 and the power inductor L1 with the composite electronic component according to the exemplary embodiment of the present disclosure, a length of wiring may be minimized. Also, since the number of disposed elements is reduced, an optimal element layout may be accomplished.

Namely, according to the exemplary embodiment of the present disclosure, the power management unit, the power inductor, and the high capacity capacitor may be disposed as close as possible, and since wirings of power lines are designed to be short and thick, noise may be reduced.

Meanwhile, electronic device manufacturers have strived to reduce a size of PCBs provided in electronic devices to meet consumer demand. Thus, it is required to enhance a degree of integration of ICs mounted on PCBs. In the exemplary embodiment of the present disclosure, since a plurality of elements are combined as a single composite component, like the composite electronic component, such demand may be satisfied.

Also, according to the exemplary embodiment of the present disclosure, since two components (second capacitor and power inductor) are implemented as a single composite electronic component, a PCB mounting area may be reduced. According to the exemplary embodiment of the present disclosure, a mounting area may be reduced by approximately 10% to 30% over an existing layout pattern.

Also, according to the exemplary embodiment of the present disclosure, the power management unit 500 may supply power to an IC to receive driving power, by a shortest wiring.

Board Having Multilayer Ceramic Capacitor Mounted Thereon

Figure 13:
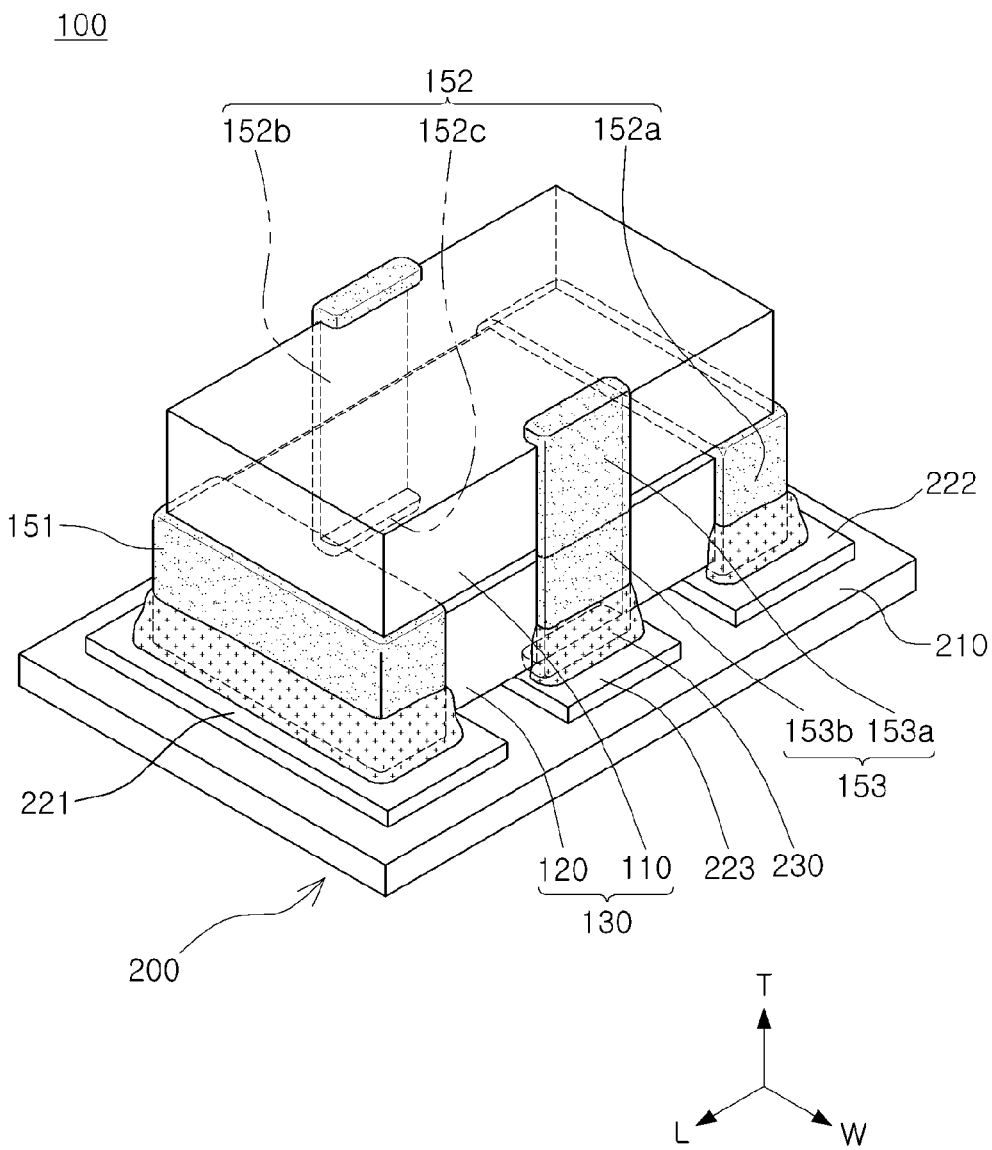
FIG. 13 is a perspective view illustrating the composite electronic component of FIG. 1 mounted on a printed circuit board.

FIG. 13 is a perspective view illustrating the composite electronic component of FIG. 1 mounted on a printed circuit board (PCB).

Figure 14:
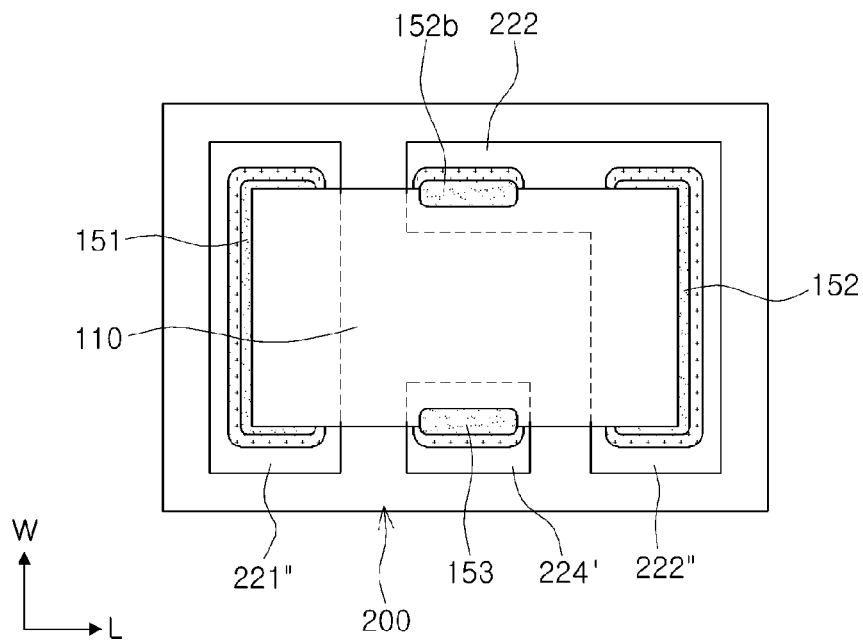
FIG. 14 is a plan view of the composite electronic component of FIG. 13.
Figure 15:
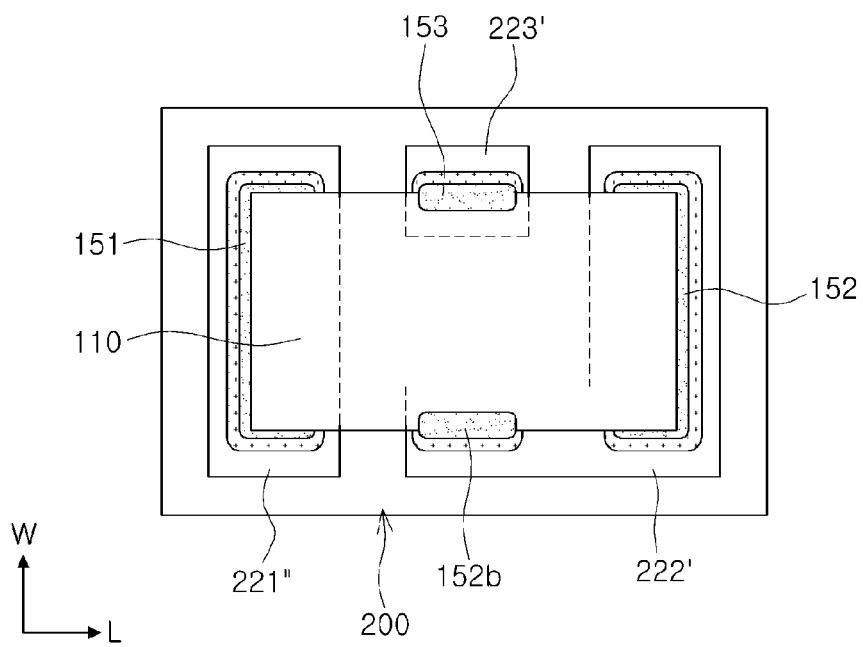
FIG. 15 is a plan view of the composite electronic component according to another embodiment of FIG. 13.

FIG. 14 is a plan view of the composite electronic component of FIG. 13;

FIG. 15 is a plan view of the composite electronic component according to another embodiment of FIG. 13.

Figure 16:
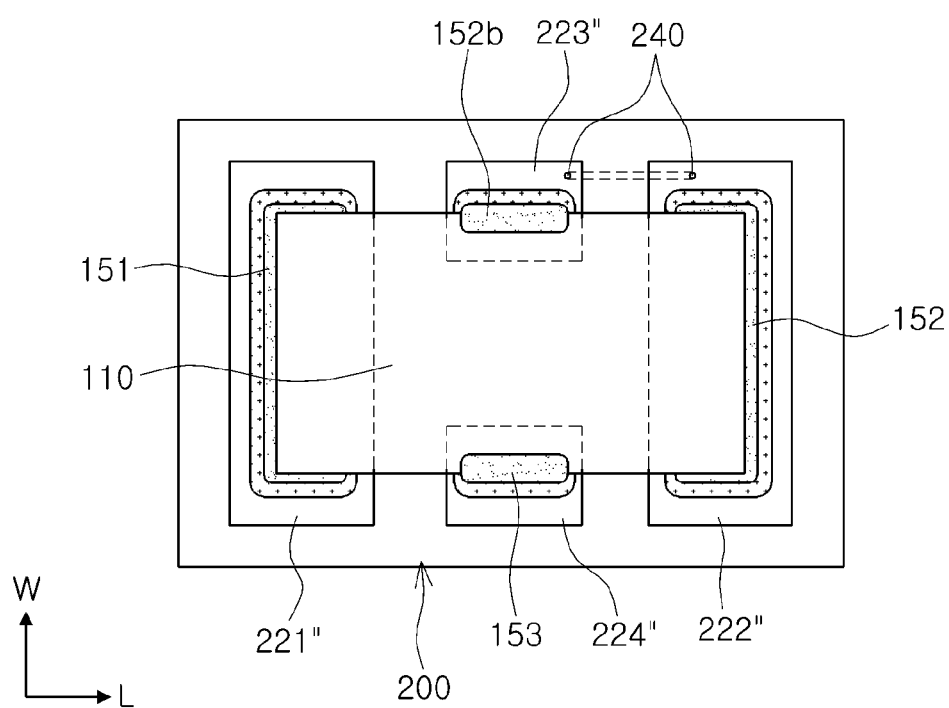
FIG. 16 is a plan view of the composite electronic component according to another embodiment of FIG. 13.

FIG. 16 is a plan view of the composite electronic component according to another embodiment of FIG. 13.

Referring to FIGS. 13 and 14, a mounting board 200 of a composite electronic component 100 according to the present exemplary embodiment includes a printed circuit board (PCB) 210 on which the composite electronic component 100 is mounted, and three or more electrode pads 221, 222, and 223 formed on an upper surface of the PCB 210.

The electrode pads 221, 222, and 223 may be formed as first to third electrode pads 221, 222, and 223 connected to an input terminal 151, an output terminal 152, and a ground terminal 153 of the composite electronic component 100, respectively.

Here, in a state in which the input terminal 151, the output terminal 152, and the ground terminal 153 of the composite electronic component 100 are positioned to be in contact with the first to third electrode pads 221, 222, and 223, the composite electronic component 100 may be electrically connected to the PCB 210 by solder 230.

In particular, referring to FIGS. 13 and 14, the output terminal 152 may include a first output terminal 152 and second output terminals 152b and 152c, and the second electrode pad 222 in contact therewith may have an 'L' shape.

In a state in which the composite electronic component 100 is mounted on the PCB 210, when a voltage is applied thereto, acoustic noise may be generated.

In this case, a size of the first to third electrode pads 221, 222, and 223 may be an indicator determining an amount of the solder 230 connecting the input terminal 151, the output terminal 152, and the ground terminal 153 of the composite electronic component 100 to the first to third electrode pads 221, 222, and 223, and magnitude of the acoustic noise may be adjusted by an amount of the solder 230.

With the composite electronic component 100 mounted on the PCB 210, when voltages having different polarities are applied to the input terminal 151, the output terminal 152, and the ground terminal 153 formed on both end surfaces and both lateral surfaces of the composite electronic component 100, the ceramic body may expand and contract in the thickness direction due to inverse piezoelectric effect and both lateral surfaces of the input terminal 151 and the output terminal 152 contact and expand due to the Poisson effect, on the contrary to the expansion and contraction of the ceramic body in the thickness direction.

Here, since the composite electronic component 100 according to the present exemplary embodiment is configured such that the capacitor is formed on the inductor, when the composite electronic component 100 is mounted on a board, transmission of vibrations of the capacitor due to inverse piezoelectricity thereof to the board may be reduced, reducing acoustic noise.

Referring to FIG. 15, in another exemplary embodiment of the present disclosure, first to third electrode pads 221', 222', and 223' may be provided to be connected to the input terminal 151, the output terminal 152, and the ground terminal 153 of the composite electronic component 100.

According to another exemplary embodiment of the present disclosure, the second electrode pad 222' may be disposed to be symmetrical to the second electrode pad 222 of the composite electronic component 100 according to the exemplary embodiment of the present disclosure as described above.

Meanwhile, referring to FIG. 16, in another exemplary embodiment of the present disclosure, a first electrode pad 221" may be connected to the input terminal 151 of the composite electronic component 100, a second electrode pad 222" may be connected to the first output terminal 152a of the composite electronic component 100, a third electrode pad 223" may be connected to the second output terminals 152b and 152c, and a fourth electrode pad 224" may be connected to the ground terminal 153.

The second electrode pad 222" and the third electrode pads 223" may be connected by a via 240, but the present disclosure is not limited thereto.

As set forth above, according to exemplary embodiments of the present disclosure, a composite electronic component capable of reducing an area for mounting components in a driving power supply system may be provided.

Also, a composite electronic component capable of suppressing generation of noise in a driving power supply system may be provided.

In addition, in the composite electronic component, since the capacitor is disposed on the top of the inductor, transmission of vibrations of the capacitor due to inverse piezoelectricity thereof when the composite electronic component is mounted on a board may be reduced, thus reducing acoustic noise.

Moreover, since the bonding unit of the inductor and the capacitor is a conductive resin layer, damage such as cracks of the capacitor due to mechanical stress such as thermal shock, or the like, may be prevented.

While exemplary embodiments have been shown and described above, it will be apparent to those skilled in the art that modifications and variations could be made without departing from the spirit and scope of the present disclosure as defined by the appended claims.

What is claimed is:

1. A composite electronic component, comprising:
 a composite body including a combination of a capacitor chip having a ceramic body and an inductor chip having a magnetic body with a coil unit, the ceramic body including a plurality of dielectric layers and first and second internal electrodes disposed to face one another with the dielectric layers interposed therebetween, the first internal electrodes respectively having a lead out portion exposed to a first lateral surface and the second internal electrodes respectively having a lead out portion exposed to a second lateral surface;
 a first external electrode disposed on the first lateral surface of the ceramic body and electrically connected to the first internal electrodes and a second external electrode disposed on the second lateral surface of the ceramic body and electrically connected to the second internal electrodes;
 third and fourth external electrodes disposed on first and second end surfaces of the magnetic body and connected to the coil unit, and first and second dummy electrodes disposed on first and second lateral surfaces of the magnetic body;
 wherein the capacitor chip is disposed on the top of the inductor chip, and the composite body includes an input terminal having the third external electrode, output terminals including a first output terminal having the fourth external electrode and a second output terminal having the second dummy electrode and the second external electrode, and a ground terminal having the first dummy electrode and the first external electrode, and
 the capacitor chip includes the first and second external electrodes disposed on the first and second lateral surfaces thereof, respectively, the inductor chip includes the third and fourth external electrodes disposed on the first and second end surfaces thereof, respectively, and the inductor chip includes the first and second dummy electrodes disposed on the first and second lateral surfaces thereof, respectively.

2. The composite electronic component of claim 1, wherein the magnetic body is configured by laminating a plurality of magnetic layers respectively having a conductive pattern formed thereon, and the conductive patterns constitutes the coil unit.

3. The composite electronic component of claim 1, wherein the inductor chip is a power inductor.

4. The composite electronic component of claim 1, wherein the capacitor chip and the inductor chip are connected by a conductive adhesive.

5. A board having a composite electronic component mounted thereon, the board comprising:
 a printed circuit board (PCB) having three or more electrode pads formed on an upper surface thereof;
 the composite electronic component according to claim 1, installed on the PCB; and
 solder connecting the electrode pads and the composite electronic component.

* * * * *